(12) United States Patent
Xue et al.

(10) Patent No.: US 12,555,993 B2
(45) Date of Patent: Feb. 17, 2026

(54) WIRED TRANSCEIVER WITH OVERVOLTAGE PROTECTIONS

(71) Applicant: SigmaStar Technology Ltd., Fujian (CN)

(72) Inventors: Jian-Feng Xue, Shanghai (CN); Zhong Yuan Wan, Shanghai (CN); Zhun Chen, Shanghai (CN); Guo Dong Liang, Shanghai (CN)

(73) Assignee: SIGMASTAR TECHNOLOGY LTD., Fujian (CN)

( * ) Notice: Subject to any disclaimer, the term of this patent is extended or adjusted under 35 U.S.C. 154(b) by 394 days.

(21) Appl. No.: 18/298,547

(22) Filed: Apr. 11, 2023

(65) Prior Publication Data
US 2023/0344217 A1   Oct. 26, 2023

(30) Foreign Application Priority Data
Apr. 20, 2022   (CN) .......................... 202210416359.1

(51) Int. Cl.
*H02H 3/20*   (2006.01)
(52) U.S. Cl.
CPC ..................................... *H02H 3/20* (2013.01)
(58) Field of Classification Search
CPC .. H02H 3/20; H02H 9/045; H03K 19/018585; H03K 19/018592; H04B 1/401; H04B 1/40
See application file for complete search history.

(56) References Cited

U.S. PATENT DOCUMENTS

| | | | | |
|---|---|---|---|---|
| 2006/0234650 A1* | 10/2006 | Lee | ..................... | H03F 3/45475 455/78 |
| 2012/0202438 A1* | 8/2012 | Huang | ................. | H03K 17/063 327/434 |

FOREIGN PATENT DOCUMENTS

CN          106911327 B   *   1/2020   ........... H03K 17/689

* cited by examiner

*Primary Examiner* — Zhitong Chen
(74) *Attorney, Agent, or Firm* — Edell, Shapiro & Finnan, LLC (57) ABSTRACT

A wired transceiver includes an output stage circuit and an input stage circuit. The output stage operates in one of a first mode and a second mode according to a mode control signal, and transmits multiple output signals to multiple output pads and receives a first set of bias voltages to provide a first overvoltage protection in the first mode, and stops transmitting the output signals and receives a second set of bias voltages to provide the overvoltage protection in the second mode. The input stage circuit receives multiple input signals from the output pads when the output stage circuit operates in the second mode, and attenuates the input signal to provide a second overvoltage protection.

9 Claims, 5 Drawing Sheets

WIRED TRANSCEIVER WITH OVERVOLTAGE PROTECTIONS

This application claims the benefit of China application Serial No. CN202210416359.1, filed on Apr. 20, 2022, the subject matter of which is incorporated herein by reference.

BACKGROUND OF THE INVENTION

Field of the Invention

The present application relates to a transmitter, and more particularly to a transceiver which provides an overvoltage protection and can be implemented by transistors having a relatively lower withstand voltage.

Description of the Related Art

Dimensions of transistors continue to reduce as manufacturing processes advance, such that the withstand voltage of transistors also keeps getting lower. However, in current applications, signal transceivers in Ethernet applications still need to transmit signals having higher levels. If a current transceiver is directly implemented by transistors having a low withstand voltage, these transistors may be damaged due to withstanding overly large voltages, resulting in lowered reliability of the transceiver.

SUMMARY OF THE INVENTION

In some embodiments, it is an object of the present application to provide a wired transceiver, which provides an overvoltage protection and can be implemented by transistors having a lower withstand voltage, so as to improve the issues of the prior art.

In some embodiments, a wired transceiver includes an output stage circuit and an input stage circuit. The output stage operates in one of a first mode and a second mode according to a mode control signal, and transmits multiple output signals to multiple output pads and receives a first set of bias voltages to provide a first overvoltage protection in the first mode, and stops transmitting the output signals and receives a second set of bias voltages to provide the overvoltage protection in the second mode. The input stage circuit receives multiple input signals from the output pads when the output stage circuit operates in the second mode, and attenuates the input signal to provide a second overvoltage protection.

Features, implementations and effects of the present application are described in detail in preferred embodiments with the accompanying drawings below.

BRIEF DESCRIPTION OF THE DRAWINGS

To better describe the technical solution of the embodiments of the present application, drawings involved in the description of the embodiments are introduced below. It is apparent that, the drawings in the description below represent merely some embodiments of the present application, and other drawings apart from these drawings may also be obtained by a person skilled in the art without involving inventive skills.

DETAILED DESCRIPTION OF THE INVENTION

All terms used in the literature have commonly recognized meanings. Definitions of the terms in commonly used dictionaries and examples discussed in the disclosure of the present application are merely exemplary, and are not to be construed as limitations to the scope or the meanings of the present application. Similarly, the present application is not limited to the embodiments enumerated in the description of the application.

The term "coupled" or "connected" used in the literature refers to two or multiple elements being directly and physically or electrically in contact with each other, or indirectly and physically or electrically in contact with each other, and may also refer to two or more elements operating or acting with each other. As given in the literature, the term "circuit" may be a device connected by at least one transistor and/or at least one active element by a predetermined means so as to process signals.

Figure 1:
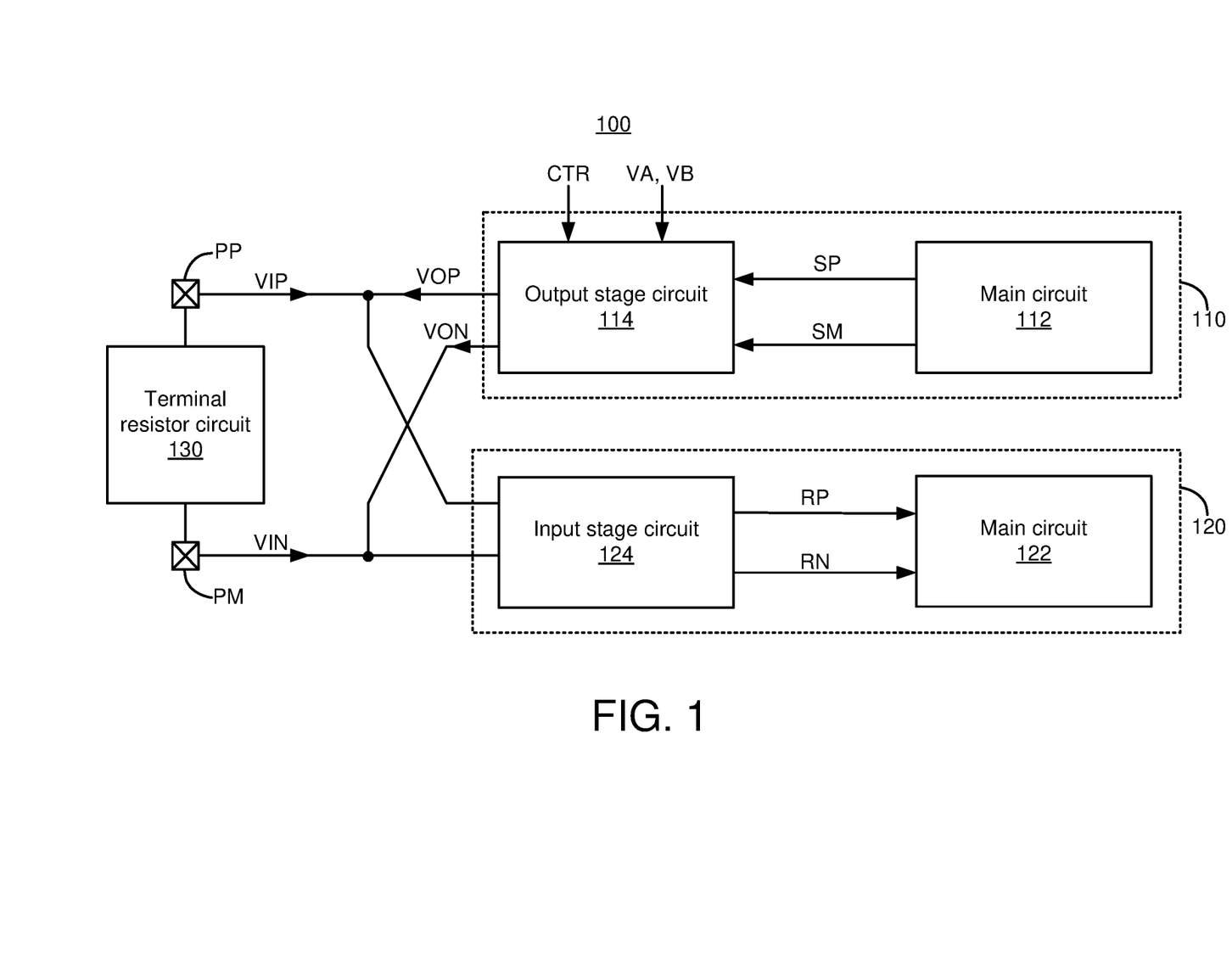
FIG. 1 is a schematic diagram of a wired transceiver according to some embodiments of the present application.

FIG. 1 shows a schematic diagram of a wired transceiver 100 according to some embodiments of the present application. In some embodiments, the wired transceiver 100 may be implemented by transistors having a low withstand voltage, and provides an overvoltage protection mechanism with respect to each of a transmitter 110, a receiver 120 and a terminal resistor circuit 130, so as to output/receive signals having a higher level (for example, data signals in the Ethernet).

In some embodiments, the wired transceiver 100 includes the transmitter 110, the receiver 120 and the terminal resistor (or referred to as a termination resistor) circuit 130. Each of the transmitter 110, the receiver 120 and the terminal resistor circuit 130 is operable in one of a first mode, a second mode and a third mode according to a mode control signal CTR. In the first mode (or referred to as a transmitting mode), the transmitter 110 transmits output signals VOP and VON to output pads PP and PM, respectively. In this mode, the receiver 120 is inoperative and the terminal resistor circuit 130 is turned off to prevent from affecting the operation of the transmitter 110. In the second mode (or referred to as a receiving mode), the terminal resistor circuit 130 is turned on to provide a terminal resistance to the output pads PP and PM to perform impedance matching, the receiver 120 receives input signals VIP and VIN via the output pads PP and PM, respectively, and the transmitter 110 is inoperative so as to leave the operation of the receiver 120 unaffected. In the third mode (or referred to as a standby mode), the terminal resistor circuit 130 is turned on and couples the output pads PP and PM to the ground so as to provide an overvoltage protection, and both of the transmitter 110 and the receiver 120 are inoperative.

Figure 2:
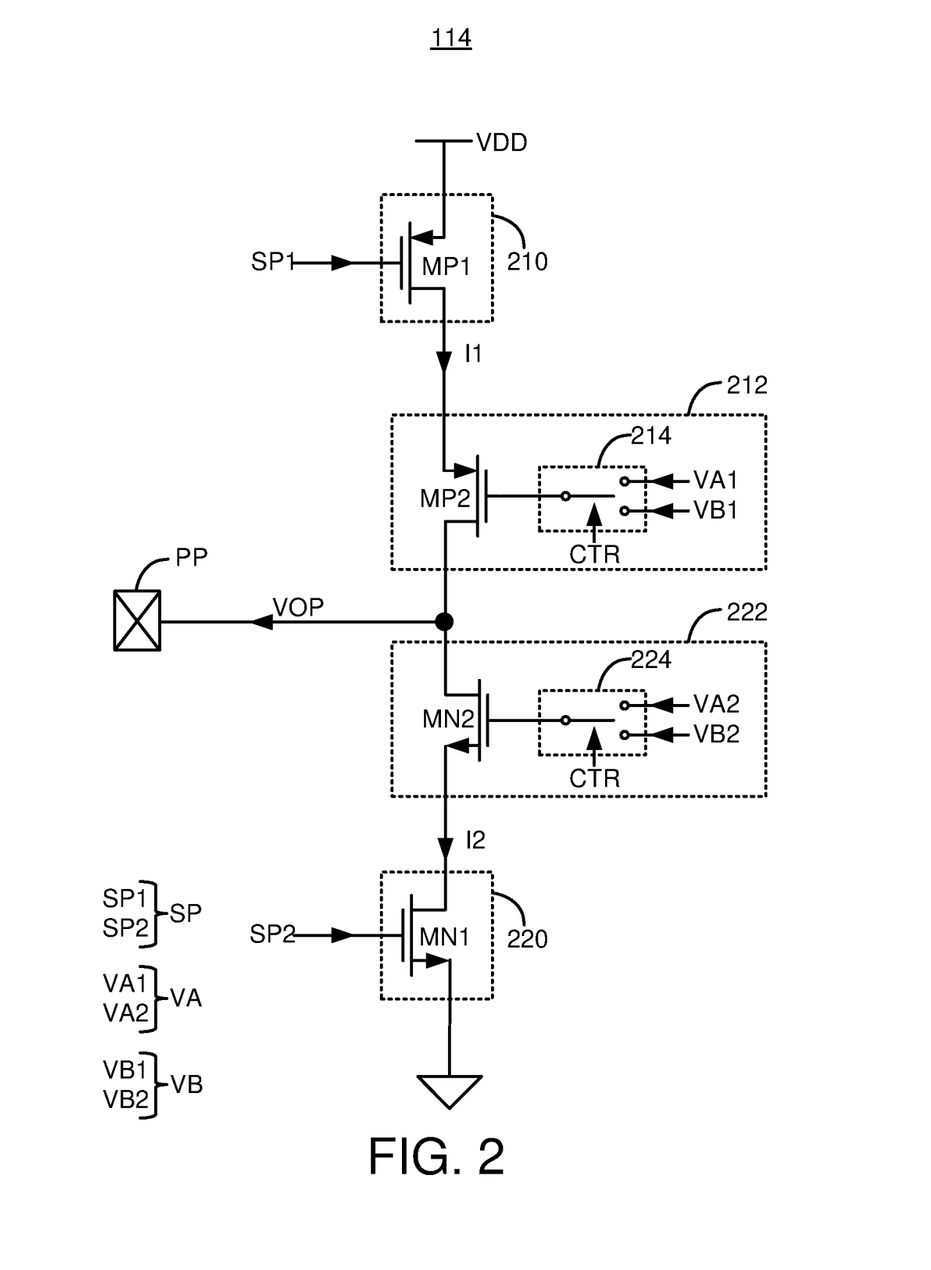
FIG. 2 is a schematic diagram of an output stage circuit in FIG. 1 according to some embodiments of the present application.

The transmitter 110 includes a main circuit 112 and an output stage circuit 114. The main circuit 112 generates a data signal set SP and a data signal set SM, wherein each of the data signal set SP and the data signal SM may include multiple data signals (for example, as shown in FIG. 2, the data signal set S includes a data signal SP1 and a data signal SP2). In some embodiments, the main circuit 112 may include, for example but not limited to, a signal processing circuit and an encoder circuit. The output stage circuit 114 operates in one of the first mode, the second and the third mode according to the mode control signal CTR.

In the first mode, the output stage circuit 114 may generate the output signal VOP according to the data signal set SP and transmit the output signal VOP to the output pad PP, and generate the output signal VON according to the data signal set SM and transmit the output signal VON to the output pad PM. The output stage circuit 114 further receives a first set of bias voltages VA to provide an overvoltage protection in the first mode, and stops generating the output signal VOP and the output signal VON and receives a second set of bias signals in the second or third mode so as to continue providing the overvoltage protection.

The receiver 120 includes a main circuit 122 and an input stage circuit 124. In the first mode or the third mode, the receiver 120 is inoperative (that is, not receiving signals from the output pad PP and the output pad PM). In the second mode, the input stage circuit 124 may receive the input signal VIP from the output pad PP and receive the input signal VIN from the output pad PM, and attenuate the input signal VIP and the input signal VIN to generate an input signal RP and an input signal RN, so as to provide the main circuit 122 with an overvoltage protection. For example, the input stage circuit 124 may perform voltage dividing and filtering on the input signal VIP and the input signal VIN to attenuate the input signal VIP and the input signal VIN. The main circuit 122 may process the input signal RP and the input signal RN to read information carried on the input signal VIP and the input signal VIN. In some embodiments, the main circuit 122 may include, for example but not limited to, a front-end circuit and a decoder circuit.

Figure 3A:
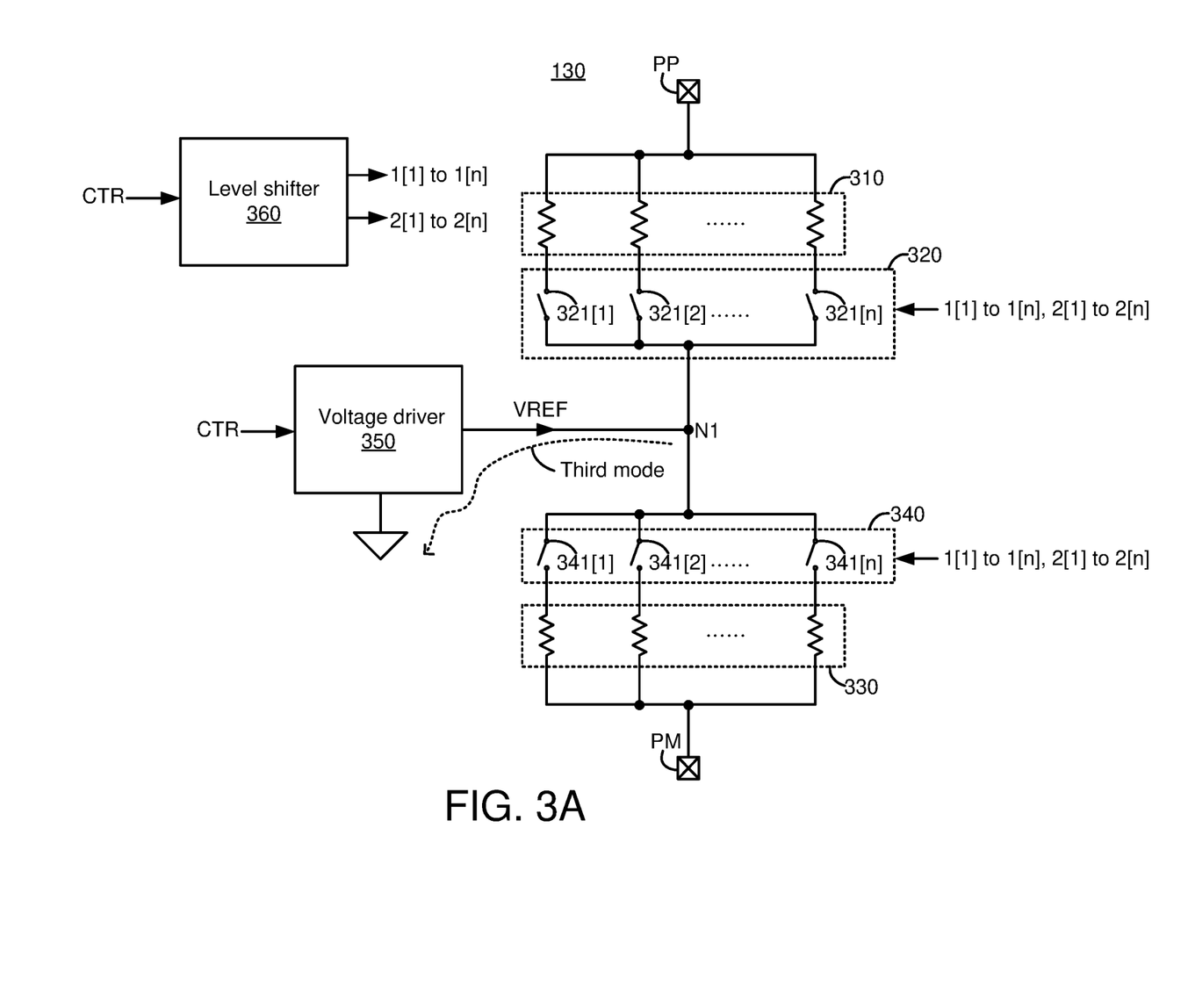
FIG. 3A is a schematic diagram of a terminal resistor circuit in FIG. 1 according to some embodiments of the present application.

In the first mode, the terminal resistor circuit 130 turns off multiple switches therein according to multiple switching signals (for example, multiple switching signals 1[1] to 1[n] and 2[1] to 2[n] in FIG. 3A), so as to prevent from affecting the operation of the transmitter 110. In the second mode, the terminal resistor circuit 130 turns on the multiple switches therein according to the multiple switching signals, so as to provide a terminal resistance to the output pads PP and PM to thereby implement impedance matching. Thus, the receiver 120 is allowed to receive the input signal VIP and the input signal VIN that are more complete. In the third mode, the terminal resistor circuit 130 is kept turned on and couples the output pads PP and PM to the ground, so as to ensure that the output pads PP and PM have a fixed potential to thereby achieve an overvoltage protection to a certain extent. Moreover, the multiple switching signals above have different levels in different modes (for example, in FIG. 3A, the levels of the switching signals 1[1] to 1[n] in the first mode are different from the levels in the second mode or the third mode, and the levels of the switching signals 2[1] to 2[n] in the first mode are different from the levels in the second mode or the third mode), and the terminal resistor circuit 130 receives a reference voltage (for example, the reference voltage VREF in FIG. 3A) in both of the first mode and the second mode, so as to provide an overvoltage protection.

With the overvoltage protection provided by the circuits above, transistors having a lower withstand voltage may be used to implement the wired transceiver 100, while the wired transceiver 100 may still be used to transmit/receive data or signals having a higher level so as to be suitable for more diversified applications (for example but not limited to, the Ethernet).

FIG. 2 shows a schematic diagram of the output stage circuit 114 in FIG. 1 according to some embodiments of the present application. For better understanding, FIG. 2 depicts only a circuit portion in the output stage circuit 114 that generates the output signal VOP to the output pad PP according to the data signal set SP. It should be understood that, the output stage circuit 114 further includes the other circuit portion that generates the outputs signal VON to the output pad PM according to the data signal set SM, and the circuit structure of the other circuit portion is identical to the circuit structure shown in FIG. 2.

Referring to FIG. 2, the output stage circuit 114 includes a conversion module 210, a protection module 212, a conversion module 220 and a protection module 222. The conversion module 210, the protection module 212, the protection module 222 and the conversion module 220 are sequentially connected in series, and the protection module 212 and the protection module 222 are coupled to the output pad PP. The conversion module 210 converts the data signal SP1 in the data signal set SP into a current signal I1. The protection module 212 may select a corresponding bias voltage according to the mode control signal CTR. For example, in the first mode, the protection module 212 turns on a transistor therein according to a voltage VA1 in the first set of bias voltage VA to provide an overvoltage protection, and transmits the current signal I1 to the output pad PP to generate the output signal VOP in FIG. 1. In the second mode or the third mode, the protection module 212 does not turn on the above transistor therein according to a voltage VB1 in the second set of bias voltages VB so as to continue providing the overvoltage protection.

Similarly, the conversion module 220 converts the data signal SP2 in the data signal set SP into a current signal I2. The protection module 222 may select a corresponding bias voltage according to the mode control signal CTR. For example, in the first mode, the protection module 222 turns on a transistor therein according to a voltage VA2 in the first set of bias voltage VA to provide an overvoltage protection, and draws the current signal I2 from the corresponding output pad PP to generate the output signal VOP in FIG. 1. In the second mode or the third mode, the protection module 222 does not turn on the above transistor therein according to a voltage VB2 in the second set of bias voltages VB so as to continue providing the overvoltage protection. The current signal I1 and the current signal I2 may be added on a node of the output pad PP to generate the output signal VOP.

More specifically, in some embodiments, the conversion module 210 includes a transistor MP1, the protection module 212 includes a transistor MP2 and a switching circuit 214, the conversion circuit 220 includes a transistor MN1, and the protection circuit 222 includes a transistor MN2 and a switching circuit 224. A first terminal (for example, the source) of the transistor MP1 receives a power supply voltage VDD, a second terminal (for example, the drain) of the transistor MP1 is coupled to a first terminal of the transistor MP2 so as to output the current signal I1, and a control terminal (for example, the gate) of the transistor MP1 receives the data signal SP1. The transistor MP1 may be selectively turned on according to the data signal SP1 to generate the current signal I1. A second terminal of the transistor MP2 is coupled to the output pad PP, and a control terminal of the transistor MP2 receives the voltage VA1 or the voltage VB1 via the switching circuit 214. The transistor MP2 may be selectively turned on according to the voltage received, so as to transmit the current signal I1 to the output pad PP. The switching circuit 214 may transmit the voltage VA1 or the voltage VB1 to the transistor MP2 according to the mode control signal CTR. For example, when the mode control signal CTR has a first logic value (for example, a logic value of 1), it means that the transmitter 110 is to operate in the first mode. Under such condition, the switching circuit 214 may transmit the voltage VA1 to the transistor MP2, further turning on the transistor MP2 so as to provide the transistor MP1 with an overvoltage protection. Alternatively, when the mode control signal CTR has a second logic value (for example, a logic value of 0), it means that the transmitter 110 is to operate in the second mode or the third mode. Under such condition, the switching circuit 214 may transmit the voltage VB1 to the transistor MP2, further turning off the transistor MP2 so as to provide the transistor MP1 with an overvoltage protection.

A first terminal (for example, the source) of the transistor MN1 is coupled to the ground, a second terminal (for example, the drain) of the transistor MN1 is coupled to a second terminal of the transistor MN2 so as to draw the current signal I2, and a control terminal (for example, the gate) of the transistor MN1 receives the data signal SP2. The transistor MN1 may be selectively turned on according to the data signal SP2 to generate the current signal I2. A first terminal of the transistor MN2 is coupled to the output pad PP, and a control terminal of the transistor MN2 receives the voltage VA2 or the voltage VB2 via the switching circuit 224. The transistor MN2 may be selectively turned on according to the voltage received, so as to draw the current signal I2 from the output pad PP. The switching circuit 224 may transmit the voltage VA2 or the voltage VB2 to the transistor MN2 according to the mode control signal CTR. For example, when the mode control signal CTR has a first logic value (that is, operating in the first mode), the switching circuit 224 may transmit the voltage VA2 to the transistor MN2, further turning on the transistor MN2 so as to provide the transistor MN1 with an overvoltage protection. Alternatively, when the mode control signal CTR has a second logic value (that is, operating in the second or third mode), the switching circuit 224 may transmit the voltage VB2 to the transistor MN2, further turning on the transistor MN2 so as to provide the transistor MN1 with an overvoltage protection.

In one embodiment, the level of the source supply voltage VDD is approximately 3.3 V, and the withstand voltage of each of the transistors MN1, MN2, MP1 and MP2 is approximately 1.8 V. In the first mode, the voltage range of the output signal VOP on the output pad PP is approximately between 0.4 V and 2.9 V. Under such condition, the level of each of the voltage VA1 and the voltage VA2 may be set to be approximately 1.8 V. Thus, it is ensured that a cross voltage between any two terminals of each of the multiple transistors MN1, MN2, MP1 and MP2 does not exceed the corresponding withstand voltage value, thereby achieving an overvoltage protection. Moreover, when operating in the second mode, the output stage circuit 114 is inoperative (that is, no longer generating the output signal VOP or the output signal VON), and the receiver 120 receives the input signal VIP and the input signal VIN. In the second mode, the voltage range of the output signal VIP on the output pad PP is approximately between 0.25 V and 2.75 V. Under such condition, the level of the voltage VB1 may be set to be approximately 1.8 V, and the level of the voltage VB2 may be set to be approximately 1.1 V. Thus, the transistor MP2 and the transistor MN2 are kept turned off in the second mode, and it is ensured that a cross voltage between any two terminals of each of the multiple transistors MN1, MN2, MP1 and MP2 does not exceed the corresponding withstand voltage value, thereby achieving an overvoltage protection. The operations of the multiple transistors MN1, MN2, MP1 and MP2 are the same as the operations of the multiple transistors MN1, MN2, MP1 and MP2 in the third mode, and such repeated details are omitted herein.

It should be noted that, the levels of the voltage VB1 and the voltage VB2 are adjustable according to the voltage range of the input signal VIP, so as to ensure that the transistor MP2 and the transistor MP2 are not erroneously turned on in the second mode due to different swings of the input signal VIP. If the transistor MP2 and the transistor MN2 are erroneously turned on in the second mode, it is possible that the output stage circuit 114 charges/discharges the output pad PP, resulting in distortion of the input signal VIP. Thus, by providing the first set of bias voltages and the second set of bias voltages having different levels, the bias voltages needed by the multiple transistors above may be adjusted in different modes, so as to achieve an overvoltage protection without affecting the operation of the receiver 120. It should be noted that the above numerical values of the multiple voltages and the withstand voltages of the transistors are merely examples, and the present application is not limited to these examples.

FIG. 3A shows a schematic diagram of the terminal resistor circuit 130 in FIG. 1 according to some embodiments of the present application. The terminal resistor circuit 130 includes a resistor array 310, a switch array 320, a resistor array 330, a switch array 340, a voltage driver 350 and a level shifter 360. The resistor array 310 is coupled between the output pad PP and the switch array 320. The switch array 320 is coupled between the output pad PP and a reference node N1 via the resistor array 310. The switch array 320 is selectively turned on according to the multiple switching signals 1[1] to 1[n] and 2[1] to 2[n]. The resistor array 330 is coupled between the output pad PM and the switch array 340. The switch array 340 is coupled between the output pad PM and the reference node N1 via the resistor array 330. The switch array 340 is selectively turned on according to the multiple switching signals 1[1] to 1[n] and 2[1] to 2[n].

As shown in FIG. 3A, the resistor array 310 includes multiple resistors, the switch array 320 includes multiple switch circuits 321[1] to 321[n] (with one single switch depicted), and these resistors are individually coupled to the corresponding switch circuits 321[1] to 321[n]. The switch circuits 321[1] to 321[n] are respectively controlled by the switching signals 1[1] to 1[n] and 2[1] to 2[n]. When at least one of the switch circuits is turned on, the corresponding resistors may be coupled in parallel to form a terminal resistor. The resistor array 330 includes multiple resistors, and the switch array 340 includes multiple switch circuits 341[1] to 341[n] (with one single switch depicted). The configurations of these resistors and the switch circuits 341[1] to 341[n] are the same as the configurations of the multiple resistors in the resistor array 310 and the multiple switch circuits 321[1] to 321[n], and such repeated details are omitted herein. With the configuration above, the impedance value of the terminal resistor may be adjusted by means of turning on different numbers of switch circuits.

The voltage driver 350 outputs the reference voltage VREF to the reference node N1 according to the mode control signal CTR or couples the reference voltage VREF to the ground, so as to provide an overvoltage protection. For example, in the first mode or the second mode, the voltage driver 350 may output the reference voltage VREF having a predetermined level to the reference node N1, so as to provide the switch array 320 and the switch array 340 an overvoltage protection. Alternatively, in the third mode, the voltage driver 350 may provide a path coupled to the ground (as represented by the dotted line) to couple the reference node N1 to the ground. Thus, it is ensured that the output pad PP and the output pad PM are not floated, further providing an overvoltage protection to a certain extent. In some embodiments, the voltage driver 350 may receive another mode control signal (not shown) associated with the mode control signal CTR to determine a current operating mode, wherein the another mode control signal may be used to instruct whether to enter the second mode (that is, a receiving mode). The another mode control signal is somewhat associated with the mode control signal CTR, for example, the mode control signal CTR and the another mode control signal have opposite logic values. Alternatively, in some other embodiments, the voltage driver 350 may simultaneously receive the mode control signal CTR and the another mode control signal. In some embodiments, the voltage driver 350 may include a voltage dividing circuit (not shown) and a voltage buffer (not shown). When the voltage driver 350 does not generate the reference voltage VREF, an internal diode of the voltage buffer may be turned on to couple the reference node Ni to the ground. It should be noted that the implementation details of the voltage driver 350 above are examples, and are not to be construed as limitation to the present application.

The level shifter 360 generates the multiple switching signals 1[1] to 1[n] and 2[1] to 2[n] having corresponding levels according to the mode control signal CTR, such that the switch array 330 and the switch array 340 are provided with an overvoltage protection. Related operation details are to be described with reference to FIG. 3B below.

Figure 3B:
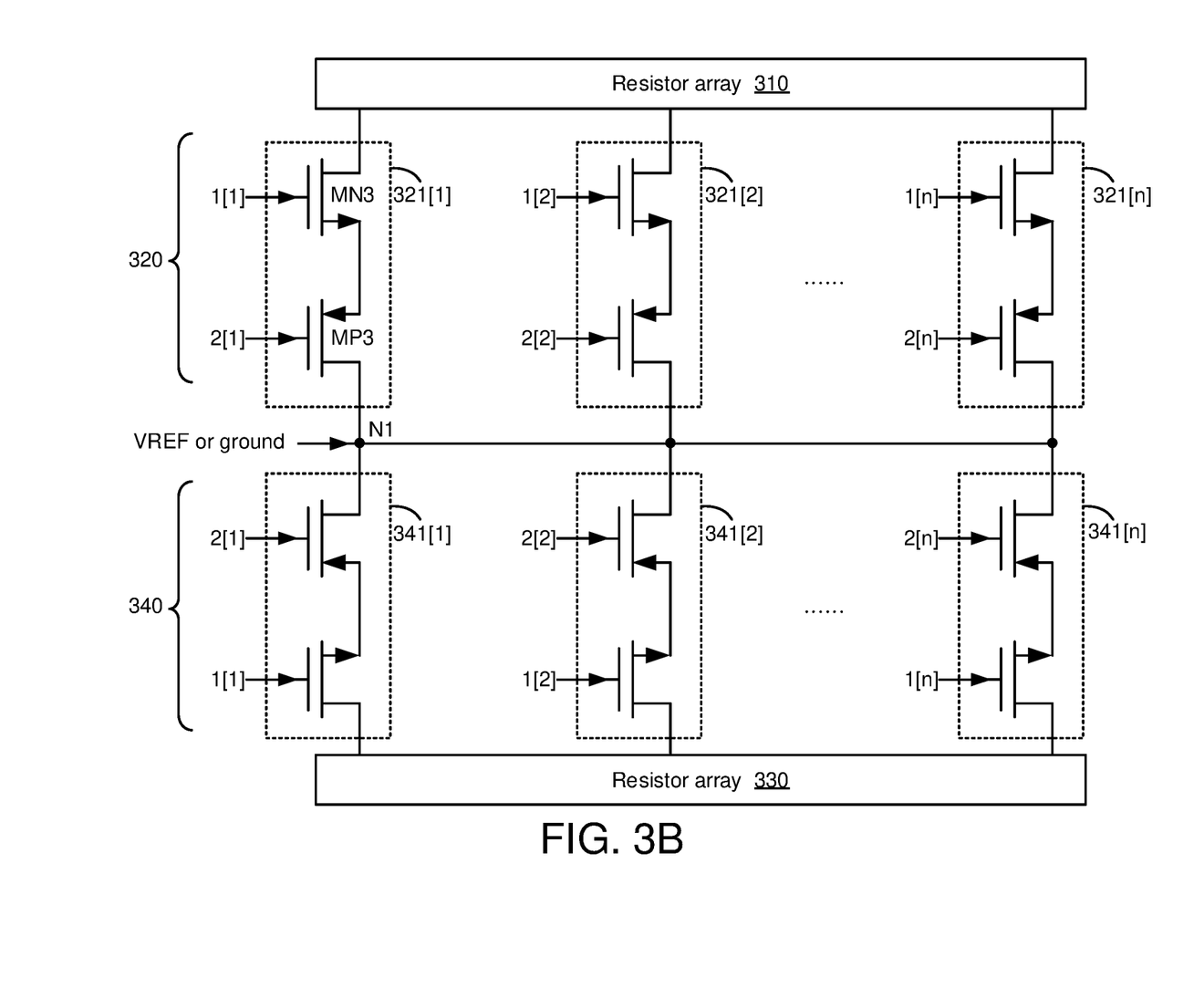
FIG. 3B is a circuit schematic diagram of multiple switch arrays in FIG. 3A according to some embodiments of the present application.

FIG. 3B shows a circuit schematic diagram of the switch array 320 and the switch array 340 in FIG. 3A according to some embodiments of the present application. The switch array 320 includes the multiple switch circuits 321[1] to 321[n]. Each of the switch circuits 321[1] to 321[n] is controlled by corresponding one of the switching signals 1[1] to 1[n] and corresponding one of the switching signals 2[1] to 2[n]. For example, the switching circuit 321[1] is controlled by the switching signal 1[1] and the switching signal 2[1], and the switch circuit 321[2] is controlled by the switching signal 1[2] and the switching signal 2[2]. Similarly, the switch array 340 includes the multiple switch circuits 341[1] to 341[n]. Each of the switch circuits 341[1] to 341[n] is controlled by corresponding one of the switching signals 1[1] to 1 [n] and corresponding one of the switching signals 2[1] to 2[n]. For example, the switching circuit 341[1] is controlled by the switching signal 1[1] and the switching signal 2[1], and the switch circuit 341[2] is controlled by the switching signal 1[2] and the switching signal 2[2].

Each of the switch circuits 321[1] to 321[n] has the same circuit structure as another. Taking the switch circuit 321[1] for example, the switch circuit 321[1] includes a transistor MN3 and a transistor MP3. A first terminal of the transistor MN3 is coupled to a resistor in the resistor array 310 in FIG. 3A, a second terminal of the transistor MN3 is coupled to a first terminal of the transistor MP3, and a control terminal of the transistor MN3 receives the switching signal 1[1]. The transistor MN3 may be selectively turned on according to the switching signal 1[1]. A second terminal of the transistor MP3 is coupled to the reference node N1, and a control terminal of the transistor MP3 receives the switching signal 2[1]. The transistor MP3 may be selectively turned on according to the switching signal 2[1]. The switching circuits 321[1] to 321[n] and the switching circuits 341[1] to 341[n] have a symmetrical structure, and repeated details are omitted herein.

In the above-mentioned embodiment, the voltage range of each of the output voltage VOP and the output signal VON is approximately between 0.4 V and 2.9 V. In the first mode, the voltage driver 350 generates the reference voltage VREF having a level of approximately 1.5 V to the reference node N1, and the level shifter 360 outputs the multiple switching signals 1[1] to 1[n] and 2[1] to 2[n] having a level of approximately 1.8 V. Thus, all of the switch circuits 321[1] to 321[n] and 341[1] to 341[n] may be kept turned off, so as to preventing from affecting the operation of the transmitter 110. Moreover, under such condition, a cross voltage between any two terminals of each of the transistor MN3 and the transistor MP3 does not exceed the withstand voltage thereof (for example, 1.8 V), so as to achieve an effect of an overvoltage protection. In other embodiments, according to the voltage range of each of the output voltage VOP and the output voltage VON, the voltage driver 350 may also couple the reference node N1 to the ground in the first mode, and continue providing the overvoltage protection.

In the second mode, the voltage driver 350 continues generating the reference voltage VREF having a level of approximately 1.5 V to the reference node N1. Assuming that the switch circuit 321[1] and the switch circuit 341[1] are selectively turned on, the level shifter 360 outputs the switching signal 1[1] having a level of approximately 3.3 V and the switching signal 2[1] having a level of approximately 0 V. Thus, the transistor MN3 and the transistor MP3 in the switch circuit 321[1] and the switch circuit 341[1] may be turned on, so that the corresponding resistors in the resistor array 310 and the resistor array 330 form a portion of the terminal resistor. Moreover, with the voltages having different levels above, the cross voltage of any two terminals in each of the transistor MN3 and the transistor MP3 does not exceed the withstand voltages thereof, so as to achieve an effect of an overvoltage protection.

In the third mode, the voltage driver 350 couples the reference node N1 to the ground, and the level shifter 360 outputs the multiple switching signals 1[1] to 1[n] having a level of approximately 3.3 V and the multiple switching signals 2[1] to 2[n] having a level of approximately 0 V. Thus, the multiple transistors MN3 and MP3 in each of the switch array 320 and the switch array 340 are turned on, such that the output pad PP and the output pad PM may be coupled to the ground via the reference node N1. Thus, the output pad PP and the output pad PM may be prevented from being floating, hence preventing unnecessary voltage hopping, further achieving an overvoltage protection.

As shown in FIG. 3B, in the switch circuit 321[1], the conductivity types of the transistor MN3 and the transistor MP3 are opposite to each other. For example, the transistor MN3 is an N-type transistor, and the transistor MP3 is a P-type transistor. In the examples in FIG. 3A and FIG. 3B, the output pad PP is coupled to the reference node N1 via the resistor array 310, the transistor MN3 and the transistor MP3, so as to ensure that the transistor MN3 and the transistor MP3 are not erroneously turned on in the first mode and to further prevent from affecting the output signal VOP and the output signal VON. In different embodiments, according to different voltage ranges of the output signal VOP and the output signal VOP, the connection orders of the transistor MN3 and the transistor MP3 may also be swapped (for example, the output pad PP is coupled to the reference node N1 sequentially via the resistor array 330, the transistor MP3 and the transistor MN3).

Figure 4:
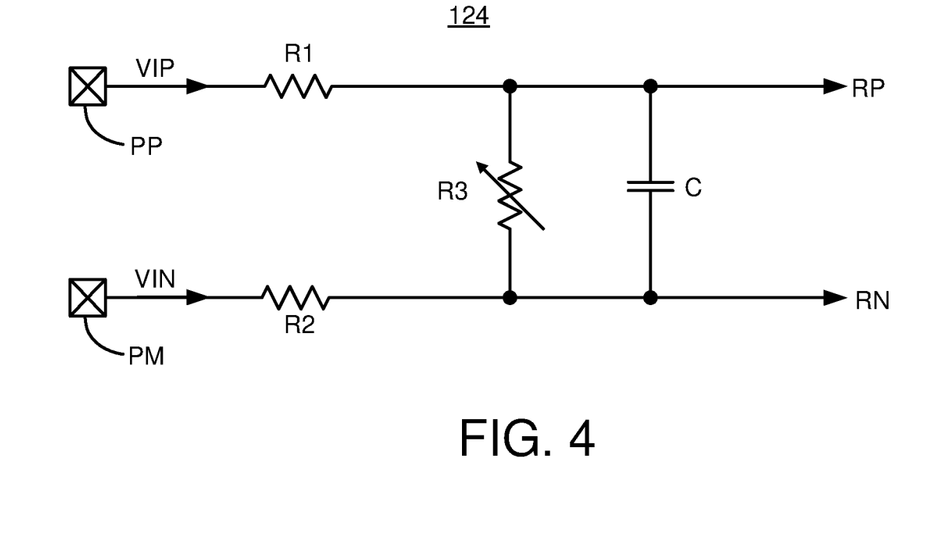
FIG. 4 is a circuit schematic diagram of an input stage circuit in FIG. 1 according to some embodiments of the present application.

FIG. 4 shows a circuit schematic diagram of the input stage circuit 124 in FIG. 1 according to some embodiments of the present application. The input stage circuit 124 includes resistors R1 to R3 and a capacitor C. In some embodiments, the impedance value of each of the resistor R1, the resistor R2 and the resistor R3 is far higher than that of the terminal resistor provided by the terminal resistor circuit 130, so as to prevent from affecting the operation of the terminal resistor circuit 130.

A first terminal of the resistor R1 is coupled to the output pad PP to receive the input signal VIP, and a second terminal of the resistor R1 is coupled to a first terminal of the resistor R3 and a first terminal of the capacitor C. A first terminal of the resistor R2 is coupled to the output pad PM to receive the input signal VIN, and a second terminal of the resistor R2 is coupled to a second terminal of the resistor R3 and a second terminal of the capacitor C. The resistor R1, the resistor R2 and the resistor R3 form a voltage dividing circuit, which divides the voltages of the multiple input signals VIP and VIN. The voltage dividing circuit and the capacitor C form a filter to attenuate noise of the multiple voltage divided input signals VIP and VIN, and to output the processed input signal RP and the processed input signal RN to the main circuit 122 in FIG. 1. The resistor R3 may be a variable resistor, whose impedance value is adjustable according to the voltage ranges of the input signal VIP and the input signal VIN, so as to ensure the result of signal attenuation. Thus, the main circuit 122 is prevented from receiving the input signal VIP and the input signal VIN having overly high levels, thereby achieving an overvoltage protection.

In conclusion, the wired transceiver according to some embodiments of the present application offers multiple overvoltage protection mechanisms, and accordingly protects the transmitter, the receiver and the terminal resistor circuit in different modes. Thus, transistors having withstand voltages of newer processes may be used to implement the wired transceiver. Moreover, according to different operating modes, the wired transceiver uses corresponding circuit settings to ensure that the operations of the remaining circuits are not affected.

While the present application has been described by way of example and in terms of the preferred embodiments, it is to be understood that the present application is not limited thereto. Various modifications made be made to the technical features of the present application by a person skilled in the art on the basis of the explicit or implicitly disclosures of the present application. The scope of the appended claims of the present application therefore should be accorded with the broadest interpretation so as to encompass all such modifications.

What is claimed is:

1. A wired transceiver, comprising:
   an output stage, operating in one of a first mode and a second mode according to a mode control signal, transmitting a plurality of output signals to a plurality of output pads and receiving a first set of bias voltages to provide a first overvoltage protection in the first mode, and stopping transmitting the output signals and receiving a second set of bias voltages to provide the overvoltage protection in the second mode; and
   an input stage circuit, receiving a plurality of input signals from the output pads when the output stage circuit operates in the second mode, and attenuating the input signals to provide a second overvoltage protection, wherein the output stage circuit comprises:
      a first conversion module, converting a first data signal into a first current signal;
      a first protection module, in the first mode, providing the first overvoltage protection according to a first voltage in the first set of bias voltages and transmitting the first current signal to a first output pad of the output pads to generate a first output signal of the output signals, and in the second mode, providing the first overvoltage protection according to a second voltage in the second set of bias voltages;
      a second conversion module, converting a second data signal into a second current signal; and
      a second protection module, in the first mode, providing the first overvoltage protection according to a third voltage in the first set of bias voltages and drawing the second current signal from the first output pad to generate the first output signal, and in the second mode, providing the first overvoltage protection according to a fourth voltage in the second set of bias voltages.

2. The wired transceiver according to claim 1, wherein the output stage circuit is kept turned off according to the second set of bias voltages in the second mode.

3. The wired transceiver according to claim 1, wherein the output stage circuit further operates in a third mode according to the mode control signal and does not transmit the output signals, and the first protection module comprises:
   a transistor, turned on according to the first voltage in the first set of bias voltages and transmitting the first current signal to the output pad in the first mode, and turned off according to the second voltage in the second set of bias voltages in the second mode and the third mode; and
   a switching circuit, transmitting one of the first voltage in the first set of bias voltage and the second voltage in the second set of bias voltages to the transistor according to the mode control signal.

4. The wired transceiver according to claim 1, further comprising:
   a terminal resistor circuit, coupled between the output pads, in the first mode, forming an open circuit according to a plurality of first switching signals and a plurality of second switching signals and receiving a reference voltage to provide a third overvoltage protection, and in the second mode, selectively turned on according to the first switching signals and the second switching signals to provide a terminal resistor and receiving the reference voltage to provide the third overvoltage protection;
   wherein, levels of the first switching signals in the first mode are different from levels of the first switching signals in the second mode, and levels of the second switching signals in the first mode are different from levels of the second switching signals in the second mode.

5. The wired transceiver according to claim 4, wherein the output stage circuit further operates in a third mode according to the mode control signal and does not transmit the output signals, the input stage circuit does not receive the input signals in the third mode, and the terminal resistor circuit is selectively turned on according to the first switching signals and the second switching signals and couples the output pads to a ground to provide the third overvoltage protection in the third mode.

6. The wired transceiver according to claim 4, further comprising:

a level shifter, generating the first switching signals and the second switching signals according to the mode control signal.

7. The wired transceiver according to claim 1, wherein the input stage circuit performs voltage dividing and filtering on the input signals to attenuate the input signals.

8. The wired transceiver according to claim 1, wherein the input stage circuit comprises:
- a first resistor, receiving a first signal of the input signals via a first output pad of the output pads;
- a second resistor, receiving a second signal of the input signals via a second output pad of the output pads;
- a third resistor, coupled between the first resistor and the second resistor; and
- a capacitor, coupled between the first resistor and the second resistor, generating a third input signal and a fourth input signal.

9. A wired transceiver, comprising:
- an output stage, operating in one of a first mode and a second mode according to a mode control signal, transmitting a plurality of output signals to a plurality of output pads and receiving a first set of bias voltages to provide a first overvoltage protection in the first mode, and stopping transmitting the output signals and receiving a second set of bias voltages to provide the overvoltage protection in the second mode;
- an input stage circuit, receiving a plurality of input signals from the output pads when the output stage circuit operates in the second mode, and attenuating the input signals to provide a second overvoltage protection; and
- a terminal resistor circuit, coupled between the output pads, in the first mode, forming an open circuit according to a plurality of first switching signals and a plurality of second switching signals and receiving a reference voltage to provide a third overvoltage protection, and in the second mode, selectively turned on according to the first switching signals and the second switching signals to provide a terminal resistor and receiving the reference voltage to provide the third overvoltage protection, wherein, levels of the first switching signals in the first mode are different from levels of the first switching signals in the second mode, and levels of the second switching signals in the first mode are different from levels of the second switching signals in the second mode, wherein the terminal resistor circuit comprises:

a first resistor array;

a first switch array, coupled between a first output pad of the output pads and a reference node via the first resistor array, selectively turned on according to the first switching signals and the second switching signals;

a second resistor array:

a second switch array, coupled between a second output pad of the output pads and the reference node via the second resistor array, selectively turned on according to the first switching signals and the second switching signals; and a voltage driver, outputting the reference voltage to the reference node according to the mode control signal to provide the third overvoltage protection, wherein the first switch array comprises:

a first transistor, coupled to a resistor in the first resistor array, selectively turned on according to a first signal of the first switching signals; and a second transistor, coupled between the first transistor and the reference node, selectively turned on according to a second signal of the second switching signals, wherein the first transistor and the second transistor have different conductivity types.

\* \* \* \* \*